United States Patent
Choi et al.

(10) Patent No.: US 8,624,490 B2
(45) Date of Patent: Jan. 7, 2014

(54) ORGANIC LIGHT-EMITTING DEVICE AND METHOD OF MANUFACTURING THE SAME

(75) Inventors: Jin-Baek Choi, Suwon-si (KR); Won-Jong Kim, Suwon-si (KR); Jong-Hyuk Lee, Suwon-si (KR); Yoon-Hyeung Cho, Suwon-si (KR); Min-Ho Oh, Suwon-si (KR); Byoung-Duk Lee, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 664 days.

(21) Appl. No.: 11/499,927

(22) Filed: Aug. 7, 2006

(65) Prior Publication Data

US 2007/0029928 A1 Feb. 8, 2007

(30) Foreign Application Priority Data

Aug. 5, 2005 (KR) ........................ 10-2005-0071720

(51) Int. Cl.
*H01L 51/52* (2006.01)

(52) U.S. Cl.
USPC ............................. 313/512; 313/504; 313/498

(58) Field of Classification Search
USPC .................... 313/498–512; 315/169.1, 169.3; 428/917, 690–691; 438/26–29, 34, 83; 257/40, 72, 98–100, 642–643, 759, 75; 427/58, 64, 66, 532–535, 539; 445/24–25
See application file for complete search history.

(56) References Cited

U.S. PATENT DOCUMENTS

| | | | |
|---|---|---|---|
| 6,740,145 B2 | 5/2004 | Boroson et al. | |
| 7,342,249 B2 * | 3/2008 | Park et al. | ........................ 257/59 |
| 2003/0031931 A1 * | 2/2003 | Obrovac et al. | .......... 429/231.95 |
| 2003/0117066 A1 | 6/2003 | Silvernail | |
| 2003/0170496 A1 | 9/2003 | Hieda et al. | |
| 2004/0081852 A1 | 4/2004 | Chen et al. | |

(Continued)

FOREIGN PATENT DOCUMENTS

| | | | |
|---|---|---|---|
| EP | 1 014 757 A2 | 6/2000 | |
| KR | 10-2003-0024997 A | 3/2003 | |
| KR | 10-2004-0023335 | 3/2004 | |
| WO | WO 2004006628 A1 * | 1/2004 | ............. H05B 33/04 |

OTHER PUBLICATIONS

European Search Report dated Dec. 2, 2011 for European Patent Application No. EP 06 25 4124.8 which shares priority of Korean Patent Application No. KR 10-2005-0071720 with captioned U.S. Appl. No. 11/499,927.

(Continued)

*Primary Examiner* — Donald Raleigh
(74) *Attorney, Agent, or Firm* — Knobbe Martens Olson & Bear LLP

(57) ABSTRACT

An organic light-emitting device including a first substrate with an array of organic light-emitting pixels formed thereon, and a second substrate is disclosed. A transparent moisture absorption layer is disposed between the first and second substrates. The transparent moisture absorption layer efficiently absorbs moisture and/or oxygen, and thus the lifetime characteristics of the organic light-emitting device are improved. The transparent moisture absorption layer has a transmittance of about 85% or higher with respect to visible light. The layer has a thickness of about 10 to about 60,000 nm and a refractive index of about 1.45 to about 1.65 in an inert and/air atmosphere. The layer is formed on the second substrate by using chemical vapor deposition or physical vapor deposition.

13 Claims, 4 Drawing Sheets

(56) References Cited

U.S. PATENT DOCUMENTS

| | | | |
|---|---|---|---|
| 2004/0091741 A1* | 5/2004 | Lin et al. | 428/690 |
| 2004/0263075 A1* | 12/2004 | Otsuki et al. | 313/512 |
| 2005/0046349 A1* | 3/2005 | Tanaka et al. | 313/512 |
| 2005/0089705 A1 | 4/2005 | Porta et al. | |
| 2005/0116638 A1 | 6/2005 | Chung et al. | |
| 2005/0255285 A1* | 11/2005 | Uchibori et al. | 428/76 |
| 2006/0022592 A1* | 2/2006 | Boroson | 313/512 |
| 2006/0087230 A1* | 4/2006 | Ghosh et al. | 313/512 |
| 2006/0093795 A1* | 5/2006 | Wang et al. | 428/195.1 |
| 2007/0238044 A1* | 10/2007 | Nakamura | 430/137.17 |

OTHER PUBLICATIONS

Extended European Search Report dated Jul. 4, 2012 for European Patent Application No. EP 06 25 4124.8 which shares priority of Korean Patent Application No. KR 10-2005-0071720 with captioned U.S. Appl. No. 11/499,927.

European Patent Office Examination dated Nov. 27, 2012 for European Patent Application No. EP 06 254 124.8 which shares priority of Korean Patent Application No. KR 10-2005-0071720 with captioned U.S. Appl. No. 11/499,927.

* cited by examiner

| 0 hr | 24 hr | 216 hr |
|---|---|---|
| INITIAL STATE | DRAK SPOT CREATION | NO AVAILABLE |

| 0 hr | 216 hr | 504 hr |
|---|---|---|
| INITIAL STATE | GOOD | GOOD |

ORGANIC LIGHT-EMITTING DEVICE AND METHOD OF MANUFACTURING THE SAME

CROSS-REFERENCE TO RELATED PATENT APPLICATION

This application claims the priority of Korean Patent Application No. 10-2005-0071720, filed on Aug. 5, 2005, in the Korean Intellectual Property Office, the disclosure of which is incorporated herein by reference in its entirety.

BACKGROUND

1. Field of the Invention

The present invention relates to a display device, and more particularly, to an organic light-emitting device.

2. Description of the Related Art

Organic Light-Emitting Devices (OLEDs) may be vulnerable to moisture permeated into the devices. Thus, an encapsulation structure was proposed to guarantee the stable operating and lifetime of OLEDs. Generally, a metal can or a glass substrate etched in the form of a cap with a groove is used for encapsulation. In such a case, for moisture absorption, a desiccant of a powder type is mounted in the groove or a desiccant of a film type is adhered in the groove be means of a double-sided tape.

Japanese Patent Laid-Open Publication No. Hei. 9-148066 discloses an organic electroluminescent device including a laminate having a pair of electrodes facing to each other and an organic light-emitting material layer made of an organic compound interposed between the electrodes; an airtight container for preventing the exposure of the laminate to the air; and drying means, disposed in the airtight container, being made of, for example, alkaline metal oxide or alkaline earth metal oxide. However, the bulky shape of the airtight container increases the total thickness of the organic electroluminescent device. Also, opaqueness of the drying means may render the fabrication of a top-emission type device difficult, even though the drying means is maintained in a solid state after absorbing moisture.

U.S. Pat. No. 6,226,890 discloses an OLED including a desiccant layer made of a desiccant including solid particles with a particle size of 0.1 to 200 μm and a binder. However, light scattering may occur at the desiccant contained in the desiccant layer, and thus the desiccant layer may be turned translucent or opaque, which renders the fabrication of a top-emission type device difficult. In addition, there is still room for improvement in terms of the moisture absorption capability of the desiccant.

SUMMARY OF CERTAIN INVENTIVE ASPECTS

An aspect of the invention provides an organic light-emitting device, which may comprise: a first substrate; an array of organic light-emitting pixels formed on the first substrate; a second substrate opposing the first substrate and comprising an interior surface facing the first substrate; and a substantially transparent desiccant layer interposed between the first substrate and the second substrate, the layer comprising metal oxide having an average particle size of about 100 nm or less, at least part of the layer having a transmittance of about 85% or higher with respect to visible light and a refractive index of about 1.45 to about 1.65.

In the forgoing device, the desiccant layer may be disposed on the interior surface the second substrate. The desiccant layer may be formed on the first substrate. The desiccant layer may be formed between the first substrate and the array. The desiccant layer may be formed on the array. The device may be configured to emit visible light through the second substrate.

Still in the foregoing device, the desiccant layer may have a thickness of about 10 to about 60,000 nm. The metal oxide may comprise alkali metal oxide or alkaline earth metal oxide. The metal oxide may comprise one or more selected from a group consisting of lithium oxide ($Li_2O$), sodium oxide ($Na_2O$), potassium oxide ($K_2O$), barium oxide (BaO), calcium oxide (CaO), and magnesium oxide (MgO).

Another aspect of the invention provides a method of manufacturing an organic light-emitting device, which may comprise: providing a device comprising a first substrate and an array of organic light-emitting pixels form over the first substrate, the array comprising a top surface, the first substrate comprising a first surface where the array is not formed; placing a second substrate comprising a second surface such that the second surface faces the first substrate; interconnecting the first and second substrates with a sealant, wherein the first substrate, the second substrate and the sealant form an enclosed space where the array is located; and prior to interconnecting, forming a desiccant layer on at least one of the first surface, the second surface and the top surface, wherein the desiccant layer comprising metal oxide, wherein forming the desiccant layer comprises physical vapor deposition or chemical vapor deposition.

In the foregoing method, the metal oxide may be in a particulate form having an average particle size of about 100 nm or less. At least part of the desiccant layer may have a transmittance of about 85% or higher with respect to a visible light and a refractive index of about 1.45 to about 1.65. The desiccant layer may have a thickness of about 10 to about 60,000 nm.

Still in the foregoing method, forming the desiccant layer may comprise depositing metal in an oxygen atmosphere. Forming the desiccant layer may comprise depositing a metal layer and oxidizing at least part of the metal in the metal layer. Forming the desiccant layer may comprise depositing the desiccant layer on the second substrate at a temperature of the second substrate from about 20 to about 400° C. Forming the desiccant layer may comprise depositing the desiccant layer on the array at a temperature of the first substrate from about 20 to about 100° C.

Still another aspect of the invention provides an organic light-emitting device produced by the foregoing method.

A further aspect of the present invention provides an organic light-emitting device including a transparent moisture absorption layer which exhibits better moisture absorption capability and is hardly distorted, and thus, capable of being used as a top-emission type device and offering better lifetime characteristics.

According to an aspect of the present invention, an organic light-emitting device may include: a substrate; an organic light-emitting unit including a first electrode, a second electrode, and an organic film interposed between the first electrode and the second electrode; an encapsulation substrate; and a transparent moisture absorption layer interposed between the substrate and the encapsulation substrate, including metal oxide with an average particle size of 100 nm or less, and having a transmittance of 85% or more in a visible light wavelength range and a refractive index of 1.45 to 1.65 in an inert and/or air atmosphere.

According to another aspect of the present invention, a method of manufacturing an organic light-emitting device may include: preparing a substrate having, on a surface thereof, an organic light-emitting unit obtained by sequentially stacking a first electrode, an organic film, and a second electrode; forming a transparent moisture absorption layer interposed between the substrate and an encapsulation substrate by depositing alkaline metal or alkaline earth metal in an oxygen atmosphere; coating a sealant on a surface area of at least one of the substrate and the encapsulation substrate corresponding to outside the organic light-emitting unit; and joining the substrate and the encapsulation substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Embodiments of the present invention will now be described more fully with reference to the accompanying drawings, in which exemplary embodiments of the invention are shown.

An organic light-emitting device according to an embodiment of the present invention includes a transparent moisture absorption layer or desiccant layer suitable for a top-emission type or a both-direction emission type.

In an embodiment, the transparent moisture absorption layer includes metal oxide with an average particle size of about 100 nm or less, and has a transmittance of about 85% or higher in a visible light wavelength range and a refractive index of about 1.45 to about 1.65 in an inert and/or air atmosphere. The metal oxide contained in the transparent moisture absorption layer has an average particle size of about 100 nm or less, and preferably, from about 1 to about 90 nm. In certain embodiments, the average particle size may be about 2, 3, 5, 10, 15, 20, 25, 30, 35, 40, 50, 60, 70 or 80 nm. In certain embodiments, the transmittance of the desiccant layer may be about 86, 87, 88, 89, 90, 91, 92, 93, 94, 95, 95.5, 96, 96.5, 97, 97.5, 98, 98.5, 99, 99.2, 99.4, 99.6 or 99.8% with respect to visible light. In another embodiment, the transmittance of the desiccant layer may be about 95% or higher with respect to visible light.

Figure 7:
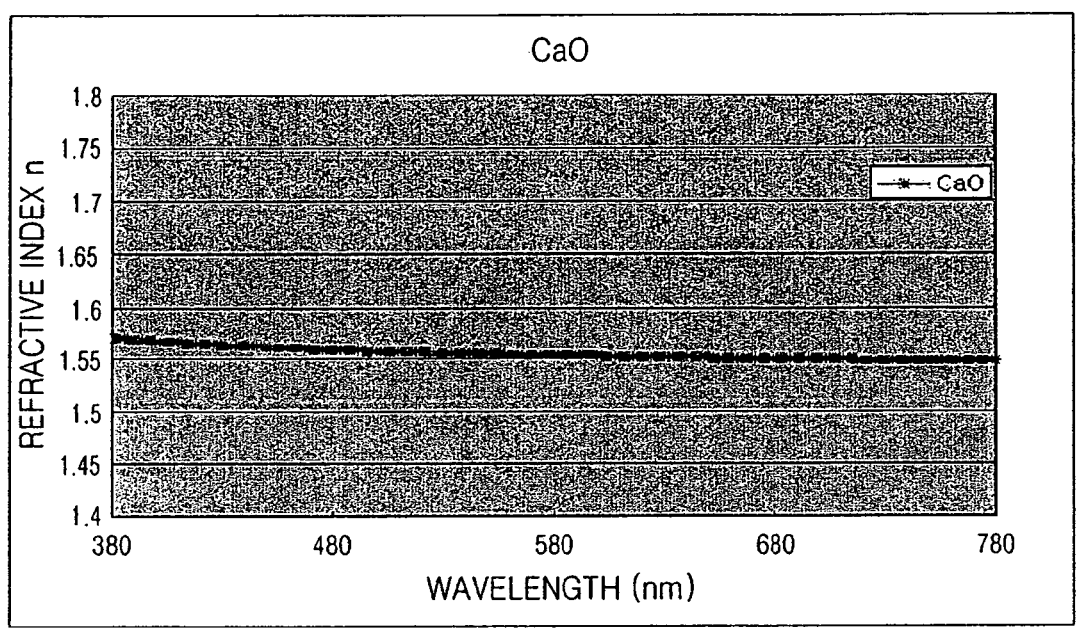
FIG. 7 is a view illustrating the refractive index of the transparent moisture absorption layer of Example 3 according to an embodiment of the present invention, measured in an air atmosphere.

In an embodiment, the refractive index of the transparent moisture absorption layer is about 1.475 to about 1.594. In certain embodiments, the refractive index of the transparent moisture absorption layer may be 1.46, 1.47, 1.48, 1.49, 1.50, 1.51, 1.52, 1.53, 1.54, 1.55, 1.56, 1.57, 1.58, 1.59, 1.60, 1.61, 1.62, 1.63 or 1.64. At this time, the refractive index of the transparent moisture absorption layer is a value measured by an ellopsometry method in a visible light wavelength range of 380 to 780 nm, in particular, 632.8 nm, in an inert and/or air atmosphere. For reference, the refractive index of bulk CaO particles is 1.84. FIG. 7 illustrates the refractive index of a CaO film measured in a visible light wavelength range of 380 to 780 nm in an air atmosphere.

In an embodiment, the metal oxide may be at least one selected from alkaline metal oxides and alkaline earth metal oxides. Examples of the alkaline metal oxides include lithium oxides ($Li_2O$), sodium oxides ($Na_2O$), and potassium oxides ($K_2O$), and examples of the alkaline earth metal oxides include barium oxides (BaO), calcium oxides (CaO), and magnesium oxides (MgO).

Figure 1:
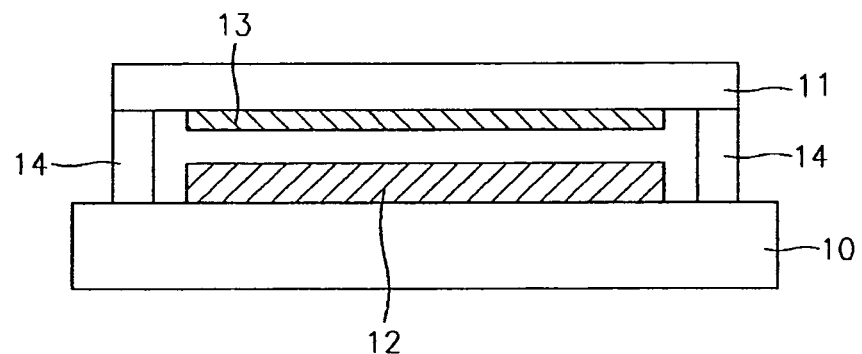
FIGS. 1 and 2 are schematic views illustrating the structures of organic light-emitting devices according to embodiments of the present invention.
Figure 2:
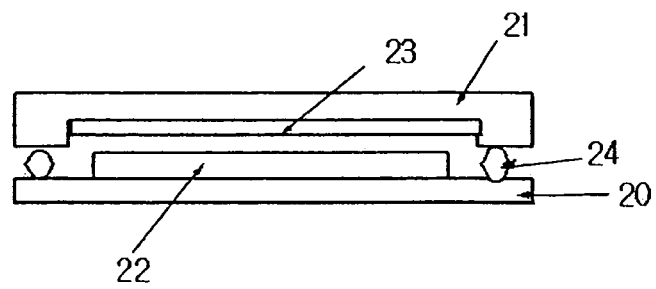

In the organic light-emitting device of the present invention, the transparent moisture absorption layer may be disposed in a space defined between a substrate and an encapsulation substrate. In particular, the transparent moisture absorption layer may be disposed on an inner surface of the encapsulation substrate, as illustrated in FIGS. 1 and 2. FIG. 1, schematically illustrates the structure of an organic light-emitting device according to an embodiment of the present invention.

Referring to FIG. 1, the organic light-emitting device includes a substrate 10 made of glass or a transparent insulating material; an organic light-emitting unit or array of organic light-emitting pixels 12, disposed on a surface of the substrate 10, having a sequentially stacked structure of a first electrode, an organic film, and a second electrode; and an encapsulation substrate 11 being joined to the substrate 10 to seal a space defined between the substrate 10 and the encapsulation substrate 11 in which the organic light-emitting unit 12 is disposed. This configuration prevents the organic light-emitting unit 12 from being exposed to the outside moisture. Further, the organic light-emitting device further includes a transparent moisture absorption layer or desiccant layer 13 on an inner surface located between the substrate 10 and the encapsulation substrate 11. In an embodiment, the encapsulation substrate 11 may be a flat glass substrate. The substrate 10 and the encapsulation substrate 11 are joined by a sealant layer 14 coated outside the organic light-emitting unit 12. Here, the encapsulation substrate 11, together with the substrate 10, seals the organic light-emitting unit 12 therebetween.

Referring to FIG. 2 illustrating the structure of an organic light-emitting device according to another embodiment of the present invention, an encapsulation substrate 21 is an etched glass substrate, and has a transparent moisture absorption layer or desiccant layer 23 on an inner surface thereof. A reference numeral 20 refers to a substrate, a reference numeral 22 is an array of organic light-emitting pixels, and a reference numeral 24 refers to a sealant layer. In a certain embodiment, the transparent moisture absorption layers 13 and 23 may have thick and transparent films made of CaO nanopaticles.

The arrays of organic light-emitting pixels 12 and 22 may be formed by sequentially depositing a first electrode, an organic film, and a second electrode. The first electrode may be a cathode, and the second electrode may be an anode. The organic film may include a hole injection layer, a hole transport layer, an emission layer, an electron injection layer, and/or an electron transport layer. The encapsulation substrates 11 and 21 may be of insulating substrates, e.g., glass or transparent plastic substrates. When transparent plastic substrates are used as the encapsulation substrates 11 and 21, a desiccant layer for absorbing of moisture may be formed on inner surfaces of the plastic substrates. The desiccant layer may be resistant to heat, chemicals, and humidity. Like this, an encapsulation substrate made of a transparent material can be applied to a top-emission type device.

For bottom-emission type, the organic light-emitting units 12 and 22 may include a first electrode made of a transparent material and a second electrode made of a reflective material. On the other hand, for top-emission type, the organic light-emitting units 12 and 22 may include a first electrode made of a reflective material and a second electrode made of a transparent material. The second electrode may include on its upper surface an inorganic protective film for planarization of the organic light-emitting units 12 and 22 to allow the organic light-emitting units 12 and 22 to be resistant to heat, chemicals, and humidity. The protective film may be made of metal oxide or metal nitride. The spaces defined between the encapsulation substrates 11 and 21 and the substrates 10 and 20, respectively, may be a vacuum or filled with an inert gas.

In an embodiment, provided that the transparency of the transparent moisture absorption layers 13 and 23 is assured, it is advantageous to form the transparent moisture absorption layers 13 and 23 to have a greater thickness. The thickness of the transparent moisture absorption layers 13 and 23 may be about 10 to about 60,000 nm, preferably about 200 to about 2,000 nm. In certain embodiments, the thickness of the layer may be about 30, 50, 100, 150, 200, 250, 300, 350, 400, 450, 500, 600, 700, 800, 900, 1000, 1100, 1200, 1300, 1400, 1500, 1600, 1700, 1800, 1900, 2000, 2500, 3000, 4000, 5000, 7000, 10000, 15000, 20000, 25000, 30000, 35000, 40000 or 50000 nm. The organic light-emitting device according to embodiments of the present invention can be applied to all of top-emission type, bottom-emission type, and both-direction emission type.

A method of manufacturing the organic light-emitting device will now be described. First, a first electrode, an organic film, and a second electrode are sequentially stacked on a substrate to form an organic light-emitting unit. Next, alkaline metal or alkaline earth metal is deposited on an encapsulation substrate in an oxygen atmosphere to form a transparent moisture absorption layer made of alkaline metal oxide or alkaline earth metal oxide. Alternatively, alkaline metal oxide or alkaline earth metal oxide is deposited on an encapsulation substrate in a vacuum atmosphere to form a transparent moisture absorption layer made of alkaline metal oxide or alkaline earth metal oxide.

In certain embodiments, the deposition of the transparent moisture absorption layer on the encapsulation substrate may be performed using a physical vapor deposition process at a substrate temperature of about 20 to about 400☐. The deposition of the transparent moisture absorption layer on the substrate having thereon the organic light-emitting unit may be performed at a substrate temperature of about 20 to about 100☐. The alkaline metal may be potassium (K), and the alkaline earth metal may be barium (Ba), calcium (Ca), or magnesium (Mg). In particular, potassium (K) and magnesium (Mg) may be used in the form of their oxides during the deposition. In an embodiment, the flow rate of oxygen varies according to the capacity of a chamber, etc., and may be about 100 sccm or less.

The transparent moisture absorption layer has sufficient moisture and oxygen absorption capability, and thus, can efficiently hermetically seal the organic light-emitting unit. In an embodiment, the transparent moisture absorption layer has a transparency of about 95 to about 98%. In an embodiment, after preparing the encapsulation substrate with the transparent hygroscopic layer as described above, a sealant is coated on a surface area of at least one of the substrate and the encapsulation substrate corresponding to outside the organic light-emitting unit, using a screen printer or a dispenser.

Then, the substrate and the encapsulation substrate are joined to complete an organic light-emitting device of the present invention. An internal enclosed space of the organic light-emitting device may be a vacuum or filled with an inert gas. Also, after the joining, the sealant may be cured by UV, visible light, or heat.

According to the above-described method of manufacturing the organic light-emitting device of the present invention, in an embodiment, forming a transparent moisture absorption layer may not us a liquid state material, but the desiccant layer can be selectively deposited on a desired area using a mask. Thus, in certain embodiments, there is no need to use an etched glass substrate. Therefore, the manufacturing method is simplified, and the total thickness of the organic light-emitting device is reduced, allowing a more compact size. Furthermore, in an embodiment, since a flat glass substrate is used instead of an etched glass substrate, an enhancement in impact resistance is expected. In addition, in another embodiment, since crystallization is done immediately after vapor-phase deposition, and a film transmittance can be adjusted by controlling process parameters, a transparent moisture absorption layer with no distortion can be obtained.

The transparent moisture absorption layer formed by the above-described method is maintained transparent before and after moisture absorption. There are no particular limitations on a driving method for an organic light-emitting device of the present invention. Both passive matrix (PM) driving and active matrix (AM) driving are possible.

Hereinafter, the present invention will be described more specifically with reference to the following Examples. The following Examples are for illustrative purposes and are not intended to limit the scope of the invention.

Example 1

Calcium was added to a thermal evaporator with oxygen supply to form a transparent moisture absorption layer made of calcium oxide to a thickness of 102 nm on a soda glass substrate. The transparent moisture absorption layer had a transmittance of 98% or more in a visible light wavelength range, and a refractive index of 1.593 in an inert atmosphere. An epoxy resin used as a sealant was coated onto a side of the soda glass substrate with the transparent moisture absorption layer and a side of a glass substrate with a first electrode, an organic film, and a second electrode. Then, both the glass substrates were joined to complete an organic light-emitting device.

Examples 2 and 3

Organic light-emitting devices were manufactured in the same manner as described in Example 1 except that transparent moisture absorption layers had a thickness of 210 nm (in Example 2) and about 480 nm (in Example 3), respectively. The transparent moisture absorption layer of Example 2 had a transmittance of 98% or more in a visible light wavelength range, and a refractive index of 1.592 in an inert atmosphere. The transparent moisture absorption layer of Example 3 had a transmittance of 98% or more in a visible light wavelength range, and a refractive index of 1.587 in an inert atmosphere.

Example 4

For reference, an organic light-emitting device was manufactured in the same manner as in Example 1 except that no transparent moisture absorption layer was formed on a soda glass substrate. The soda glass substrate had a refractive index of 1.45.

In the organic light-emitting devices manufactured in Examples 1-3, a hygroscopic amount with respect to the deposition thickness of the transparent moisture absorption layers was measured, and the results are presented in Table 1 below.

TABLE 1

| Deposition thickness (nm) | Hygroscopic amount (mg) after one hour (per area of 45 mm × 45 mm) | Hygroscopic amount (mg) after 24 hours (per area of 45 mm × 45 mm) |
| --- | --- | --- |
| 102 | 0 | 0 |
| 210 | 0.4 | 0.4 |
| 480 | 0.4 | 0.8 |

Figure 3:
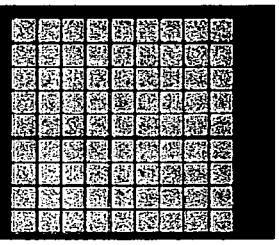
FIGS. 3 and 4 are microscopic images of organic light-emitting devices manufactured in Example 4 and Example 3, observed at 70° C., 90% Relative Humidity (RH), respectively.
Figure 4:
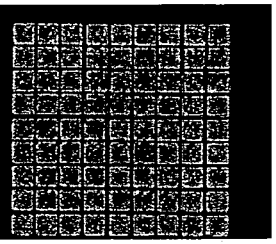
Figure 5:
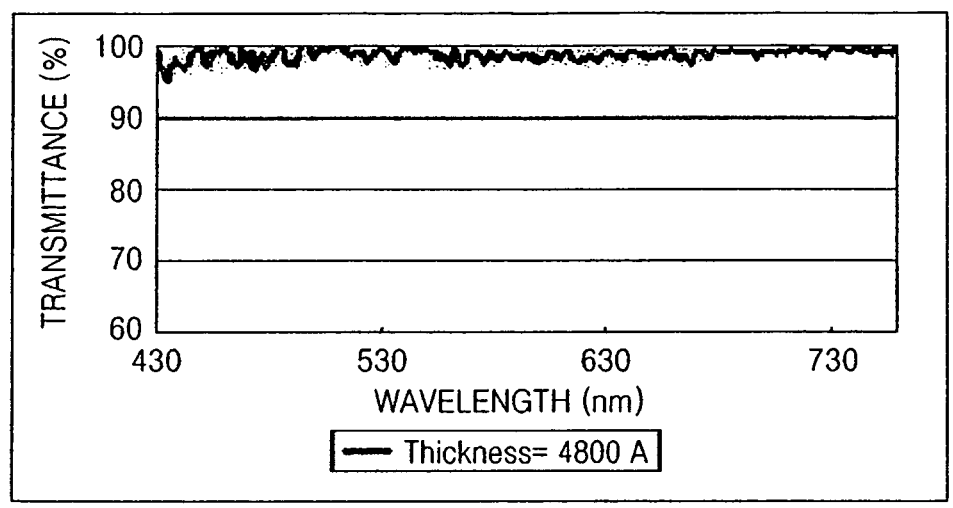
FIG. 5 is a view illustrating the transmittance of a transparent moisture absorption layer of Example 3 according to an embodiment of the present invention.
Figure 6:
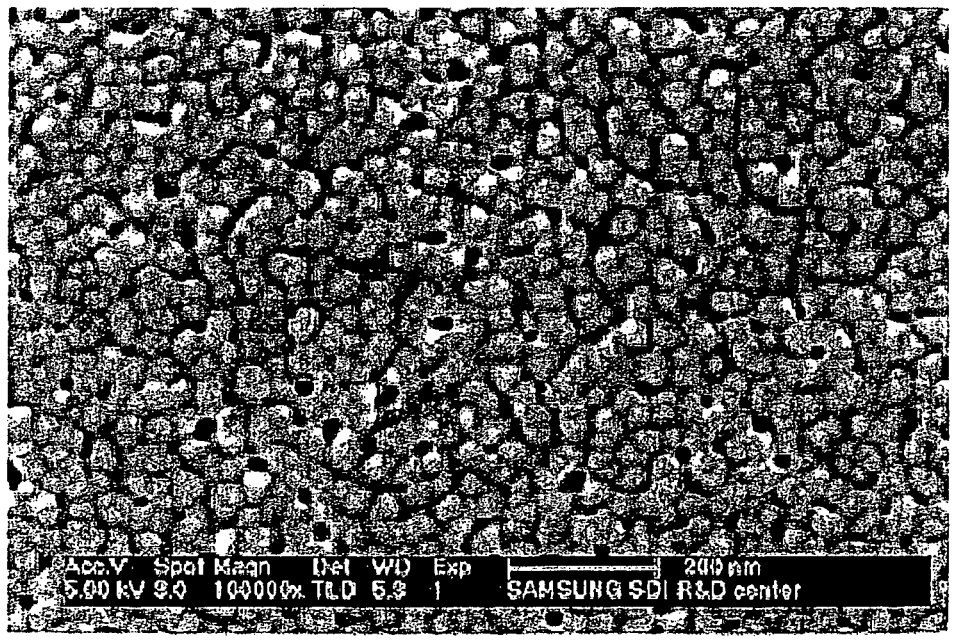
FIG. 6 is a Scanning Electron Microscopic (SEM) image showing the surface morphology of the transparent moisture absorption layer of Example 3 according to an embodiment of the present invention.

The images of the organic light-emitting devices according to Example 4 and Example 3 were observed with time using a microscope at 70 □, 90% Relative Humidity (RH), and the results are shown in FIGS. 3 and 4. FIGS. 5 and 6 respectively show the transmittance and the Scanning Electron Microscopic (SEM) image of the transparent moisture absorption layer of Example 3. Referring to FIGS. 3 and 4, in connection with the organic light-emitting device of Example 4, after 24 hours, dark spots were observed. After 216 hours, the device was not available. On the contrary, the organic light-emitting device of Example 3 exhibited good lifetime characteristics even after 504 hours.

An organic light-emitting device including a transparent moisture absorption layer according to embodiments of the present invention provides the following advantages. First, the transparent moisture absorption layer efficiently absorbs moisture and/or oxygen, and thus the lifetime characteristics of the organic light-emitting device are improved. In particular, in an accelerated lifetime test (500 hours), the organic light-emitting device maintains good lifetime characteristics. Second, the transparent moisture absorption layer is kept transparent with time and has a transmittance of about 85% or more in a film thickness range of about 10 to about 60,000 nm. Also, it has a refractive index of about 1.45 to about 1.65, and thus is preferable in terms of low refractive index film application. Third, there is no need to use an etched glass substrate as an encapsulation substrate, thereby ensuring a reduction in the total thickness of the organic light-emitting device and allowing the organic light-emitting device to have good impact resistance.

While the present invention has been particularly shown and described with reference to exemplary embodiments thereof, it will be understood by those having ordinary skill in the art that various changes may be made therein without departing from the spirit and scope of the present invention as defined by the following claims.

What is claimed is:

1. An organic light-emitting device comprising:
a first substrate comprising glass;
an array of organic light-emitting pixels formed on the first substrate;
a second substrate comprising glass, the second substrate opposing the first substrate and comprising an interior surface facing the first substrate; and
a substantially transparent vapor deposited desiccant layer interposed between the first substrate and the second substrate, said layer consisting of metal oxide particles of one or more alkali metals or alkaline earth metals, said oxide particles having a particle size from 1 nm to 90 nm, wherein at least part of the layer has a transmittance of 95% or higher with respect to visible light and a refractive index of 1.475 to 1.594, wherein the desiccant layer has a thickness of about 200 nm to about 2,000 nm, wherein the desiccant layer is formed on the array, and wherein the metal oxide comprises one or more selected from a group consisting of sodium oxide ($Na_2O$), potassium oxide ($K_2O$), barium oxide (BaO), calcium oxide (CaO), and magnesium oxide (MgO).

2. The device of claim 1, wherein the device is configured to emit visible light through the second substrate.

3. The device of claim 1, wherein the metal oxide particles have a maximum particle size from 1 nm to 90 nm.

4. The device of claim 1, wherein the refractive index of the transparent moisture absorption layer is 1.48, 1.49, 1.50, 1.51, 1.52, 1.53, 1.54, 1.55, 1.56, 1.57, 1.58, or 1.59.

5. The device of claim 1, wherein the thickness of the transparent moisture absorption layer is 250, 300, 350, 400, 450, 500, 600, 700, 800, 900, 1000, 1100, 1200, 1300, 1400, 1500, 1600, 1700, 1800, or 1900 nm.

6. The device of claim 1, wherein the metal oxide comprises one or more selected from a group consisting of sodium oxide ($Na_2O$), potassium oxide ($K_2O$) and magnesium oxide (MgO).

7. The device of claim 1, wherein the particle size is 2, 3, 5, 10, 15, 20, 25, or 30 nm.

8. The device of claim 7, wherein the oxide particles have a maximum particle size of 2, 3, 5, 10, 15, 20, 25, or 30 nm.

9. The device of claim 1, wherein the particle size may be about 35, 40, 50, 60, 70 or 80 nm.

10. The device of claim 9, wherein the oxide particles have a maximum particle size of 35, 40, 50, 60, 70 or 80 nm.

11. The device of claim 5, wherein the thickness of the transparent moisture absorption layer is 400, 450, 500, 600, 700, 800, 900, or 1000 nm.

12. The device of claim 5, wherein the thickness of the transparent moisture absorption layer is 1100, 1200, 1300, 1400, 1500, 1600, 1700, 1800, or 1900 nm.

13. The device of claim 1, wherein the thickness of the transparent moisture absorption layer is 480 nm.

* * * * *

UNITED STATES PATENT AND TRADEMARK OFFICE
CERTIFICATE OF CORRECTION

| | | |
|---|---|---|
| PATENT NO. | : 8,624,490 B2 | Page 1 of 1 |
| APPLICATION NO. | : 11/499927 | |
| DATED | : January 7, 2014 | |
| INVENTOR(S) | : Jin-Baek Choi et al. | |

It is certified that error appears in the above-identified patent and that said Letters Patent is hereby corrected as shown below:

In the Specification

Column 1, Line 25, please delete "be" and insert therefore, --by--.

Column 4, Lines 19-20, please delete "FIG. 1," and insert therefore, --FIG. 1--.

Signed and Sealed this
Seventh Day of October, 2014

Michelle K. Lee
*Deputy Director of the United States Patent and Trademark Office*